United States Patent [19]
Choi et al.

[11] Patent Number: 5,777,922
[45] Date of Patent: Jul. 7, 1998

[54] FLASH MEMORY DEVICE

[75] Inventors: Young Jung Choi, Choongcheongbuk-Do; Joo Weon Park, Seoul, both of Rep. of Korea

[73] Assignee: Hyudai Electronics Industries Co., Ltd., Kyungki-Do, Rep. of Korea

[21] Appl. No.: 730,873

[22] Filed: Oct. 18, 1996

[51] Int. Cl.[6] .................................................. G11C 16/04
[52] U.S. Cl. ............................. 365/185.05; 365/185.13; 365/185.23; 365/185.33
[58] Field of Search ...................... 365/185.05, 185.13, 365/185.33, 185.23

[56] References Cited

U.S. PATENT DOCUMENTS

| | | |
|---|---|---|
| 4,805,151 | 2/1989 | Terada et al. ............... 365/189.07 |
| 5,197,029 | 3/1993 | Schreck et al. ............. 365/185.13 |
| 5,315,541 | 5/1994 | Harari et al. ............... 365/185.13 |
| 5,432,730 | 7/1995 | Shubat et al. .............. 365/185.06 |
| 5,526,307 | 6/1996 | Yiu et al. ................... 365/185.33 |
| 5,557,124 | 9/1996 | Roy et al. .................. 365/185.12 |

*Primary Examiner*—David C. Nelms
*Assistant Examiner*—Trong Phan
*Attorney, Agent, or Firm*—Fish & Richardson P.C.

[57] ABSTRACT

The present invention provides a flash memory device wherein memory cells in each of the memory cell blocks are divided into a plurality of memory cell groups. In each memory cell group, local bit lines are laid out connected by segmentation transistors. When selecting a memory cell, only a local bit line connected to a memory cell selected by an operation of the segmentation transistor is coupled to a global bit line so that the load to be applied to the bit lines is minimized during the read out operation.

2 Claims, 3 Drawing Sheets

FLASH MEMORY DEVICE

BACK GROUND OF THE INVENTION

1. Field of the Invention

The present invention relates to a flash memory device, and in particular, to a flash memory device for reducing power consumption and increasing operation speed.

2. Information Disclosure Statement

In general, a flash memory device, such as a device and a Flash Electrically Programmable Read Only Memory (Flash EPROM) device, Electrically Erasable and Programmable Read Only Memory (EEPROM) is made up of a memory cell array and peripheral circuits. The memory cell array comprises a plurality of memory cells which are interconnected in the form of a matrix between word lines and bit lines. The peripheral circuits are formed to program, erase, or read data to and from the memory cell array in response to an external input signal. Such a flash memory device also has electrical programming and erasing functions.

The conventional flash memory device comprises a memory cell array having a plurality of memory cells which are interconnected in the form of a matrix between word lines and bit lines, and peripheral circuits formed to program, erase, or read data to and from the memory cell array in response to an external input signal. The memory cell array is divided into a plurality of memory cell blocks. For instance, for a flash memory device with the capability of 4 M-bits, one memory cell array consists of 512 K-bytes byte memory cells and is divided into eight (8) memory cell blocks. Therefore, each of the memory cell blocks has 512K bits of memory cells. In such a flash memory device, however, since several memory cells are connected to one bit line, a large load is applied over the bit line during a read out operation and power consumption is increased, thereby decreasing the characteristics of the device.

SUMMARY OF THE INVENTION

Therefore, it is an object of the present invention to provide a flash memory device which can solve the above shortcomings.

According to the present invention, memory cells in each of the memory cell blocks are divided into a plurality of memory cell groups. Segmentation transistors are connected between local bit lines which are arranged in the memory cell groups. In the case of selecting a memory cell, only a local bit line connected to a memory cell selected by operation of the segmentation transistor is coupled to a global bit line.

To this end, one embodiment of the present invention is a flash memory device comprising a plurality of memory cell groups having a plurality of local bit lines and word lines which are arranged in the form of a matrix; a pair of segmentation transistors connected between local bit lines which correspond to each other between two memory cell groups, wherein said segmentation transistors are selectively turned on in response to segmentation signals from a segmentation signal generator; and a plurality of global bit lines connected to each connection node of said segmentation transistors, respectively.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts in the several views of the drawings.

DETAILED DESCRIPTION OF THE INVENTION

The memory cell array according to the present invention comprises a plurality of memory cells being divided into a plurality of memory cell groups, and a segmentation transistor connected between the local bit lines in each of the memory cell groups. When a memory cell is selected, only a local bit line connected to that memory cell selected by operation of the segmentation transistor is coupled to a global bit line connected to a sense amplifier so that the load applied to the bit lines is minimized during a period of read out.

Figure 1:
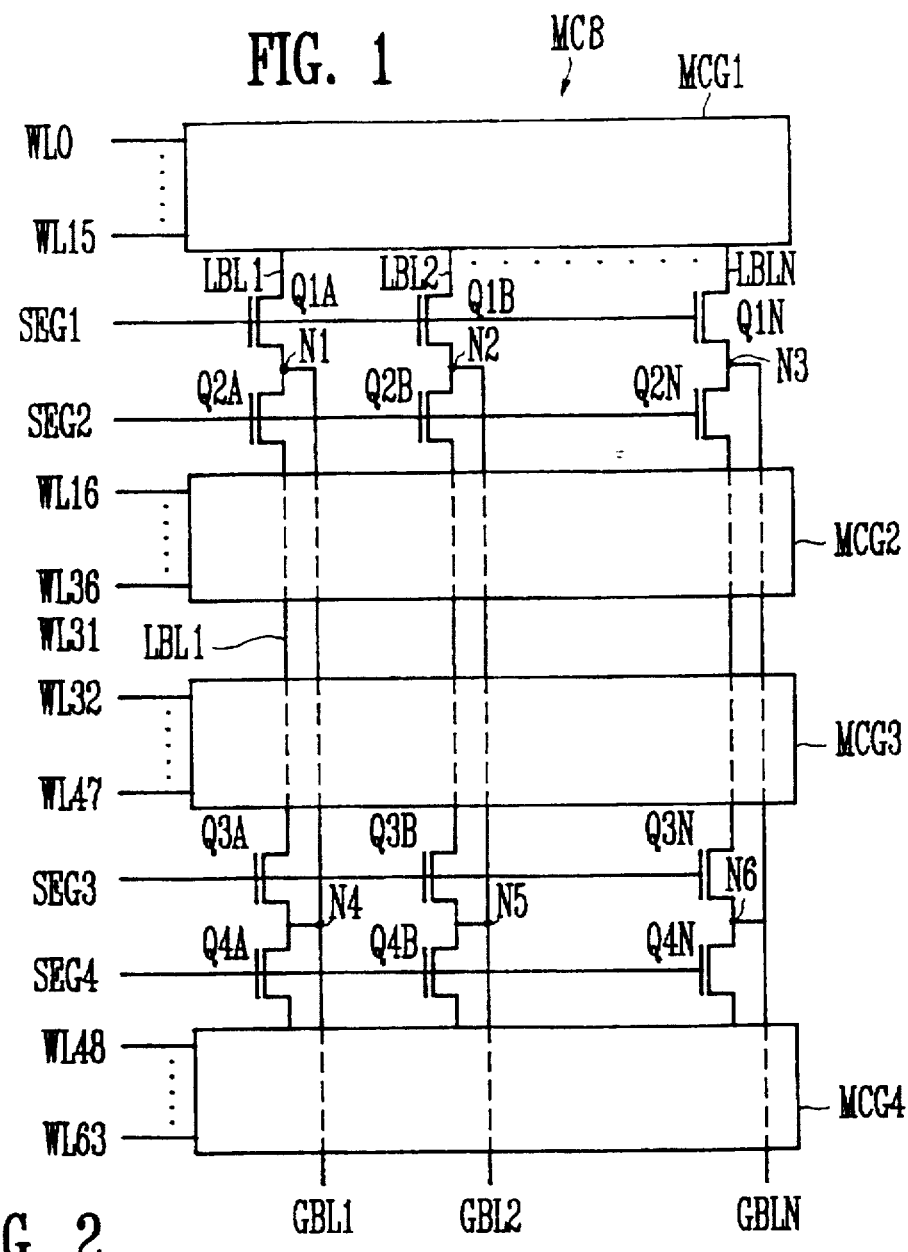
FIGS. 1 and 2 are block diagrams for explaining a flash memory device in accordance with the present invention.

FIG. 1 illustrates a memory cell block MCB which includes four memory cell groups MCG1 to MCG4. Memory cells in the first memory cell group MCG1 are arranged in the form of a matrix at each intersection between the 1st through 16th word lines WL0 to WL15 and a plurality of local bit lines LBL1 to LBLN. Memory cells existing in the second memory cell group MCG2 are arranged in the form of a matrix at each intersection between the 17th through 32nd word lines WL16 to WL31 and a plurality of local bit lines LBL1 to LBLN. Memory cells existing in the third memory cell group MCG3 are arranged in the form of a matrix at each intersection between the 33rd through 48th word lines WL32 to WL47 and a plurality of local bit lines LBL1 through LBLN. Similarly, memory cells existing in the fourth memory cell group MCG4 are arranged in the form of a matrix at each intersection between the 49th through 64th word lines WL48 to WL63 and a plurality of local bit lines LBL1 to LBLN. Moreover, segmentation transistors Q1A and Q2A are connected in series between a first local bit line LBL1 of the first memory cell group MCG1 and a first local bit line LBL1 of the second memory cell group MCG2 through a node N1. Similarly, segmentation transistors Q1B and Q2B are connected in series between a second bit line LBL2 of the first memory cell group MCG1 and a second local bit line LBL2 of the second memory cell group MCG2, through a node N2, and so on, such that the segmentation transistors Q1N and Q2N are connected in series between the nth local bit line LBLN of the first memory cell group MCG1 and the nth local bit line LBLN of the second memory cell group MCG2 through a node N3.

Also, segmentation transistors Q3A and Q4A are connected in series between a first local bit line LBL1 of the third memory cell group MCG3 and a first local bit line LBL1 of the fourth memory cell group MCG4 through a node N4. Similarly, segmentation transistors Q3B and Q4B are connected in series between a second bit line LBL2 of the third memory cell group MCG3 and a second local bit line LBL2 of the fourth memory cell group MCG4 through a node N5, and so on, such that the segmentation transistors Q3N and Q4N are connected in series between the nth local bit line LBLN of the third memory cell group MCG3 and the nth local bit line LBLN of the fourth memory cell group MCG4 through a node N6.

Figure 2:
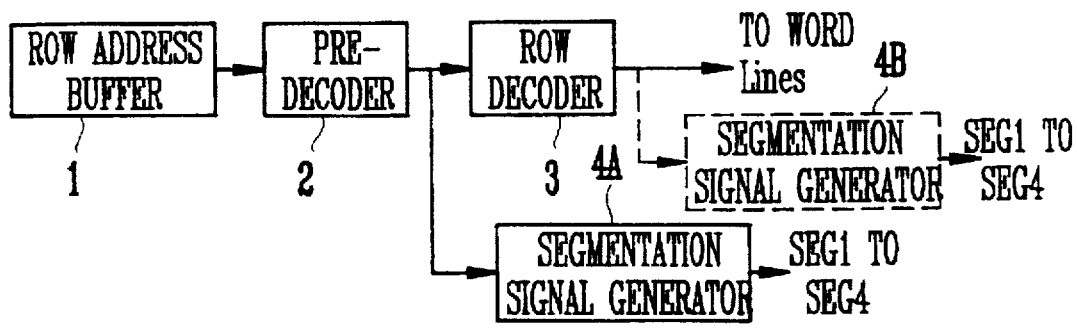

The transistors Q1A, Q1B and Q1N are turned on according to a first segmentation signal SEG1, and the transistors Q2A, Q2B and Q2N are turned on according to a second segmentation signal SEG2. While, the transistors Q3A, Q3B and Q3N are turned on according to a third segmentation signal SEG3, and the transistors Q4A, Q4B and Q4N are turned on in response to a fourth segmentation signal SEG4. In addition, a first global bit line GBL1 is connected to the nodes N1 and N4, and a second global bit line GBL2 is connected to the nodes N2 and N5. In the same manner, nth global bit line GBLN is connected to the nodes N3 and N6. The first through fourth segmentation signals SEG1 through SEG4 may be generated in two methods as shown in FIG. 2.

The first method is to utilize the output signal of a pre-decoder 2. An address signal is entered into a row address buffer 1 and it is pre-decoded by a pre-decoder 2. The output signal of the pre-decoder 2 is applied to a row decoder 3. The output signal of the row decoder 3 is used for selecting a word line. The output signal of the pre-decoder 2 is sent to a segmentational generator 4A. An output signal SEG1 to SEG4 from the segmentation signal generator 4A is input to a gate electrode of the segmentation transistors.

The second method is to use an output signal of the row decoder 3. The output signal of the row decoder 3 is sent to a segmentation signal generator 4B. An output signal SEG1 through SEG4 from the segmentation generator 4B is applied to the gate electrode of the segmentation transistors. The segmentation signal generator 4B creates a signal for the operation of a segmentation transistor Q (see FIG. 4) connected to a local bit line of a memory cell group in which there are memory cells to be selected in response to the address signal output from the row decoder 3.

Figure 3:
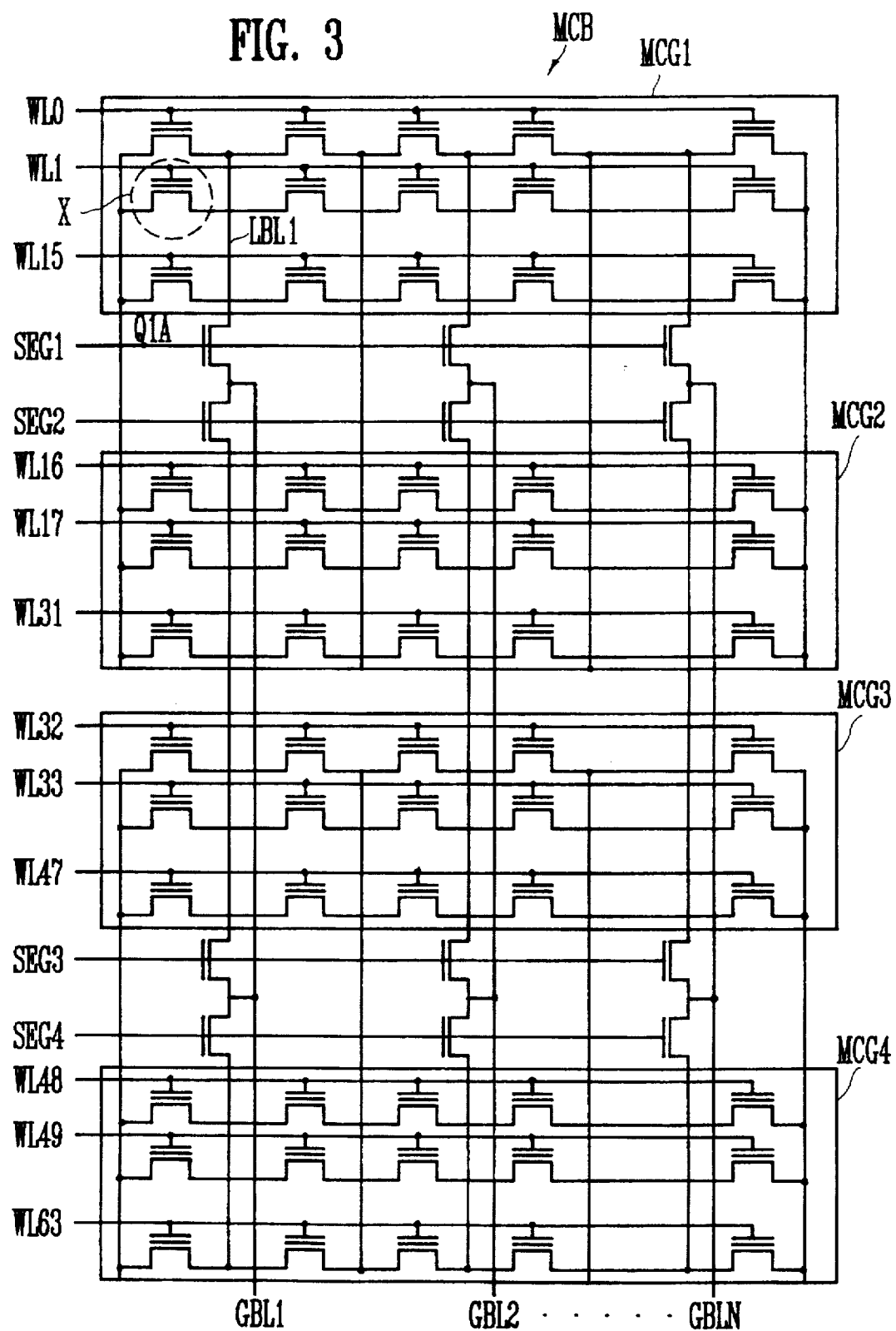
FIG. 3 illustrates a detailed circuit of FIG. 1.

Referring now to FIG. 3, a description will be given of a read out operation for a flash memory in accordance with the present invention.

As an example, when reading out data stored in a memory cell X which is located in the first memory cell group MCG1 and is connected between the second word line WL1 and the first local bit line LBL1, the first segmentation signal SEG1 is input in the state of a high level, and the second through fourth segmentation signals SEG2 through SEG4 are input in the state of a low level. Then, the first segmentation signal SEG1 in the state of the high level drives the segmentation transistor Q1A, and the first global bit line GBL1 connects to only the first local bit line LBL1 coupled to the memory cell X. Therefore, a current flows over the first global bit line GBL1 dependent on the state of data stored in the memory cell X.

As described above, since a global bit line is connected to only a memory cell coupled to a local bit line in the memory cell group during the operation, the load crossing a bit line is reduced in comparison to that in a conventional flash memory device, thereby decreasing the time delay and the power consumption.

Figure 4:
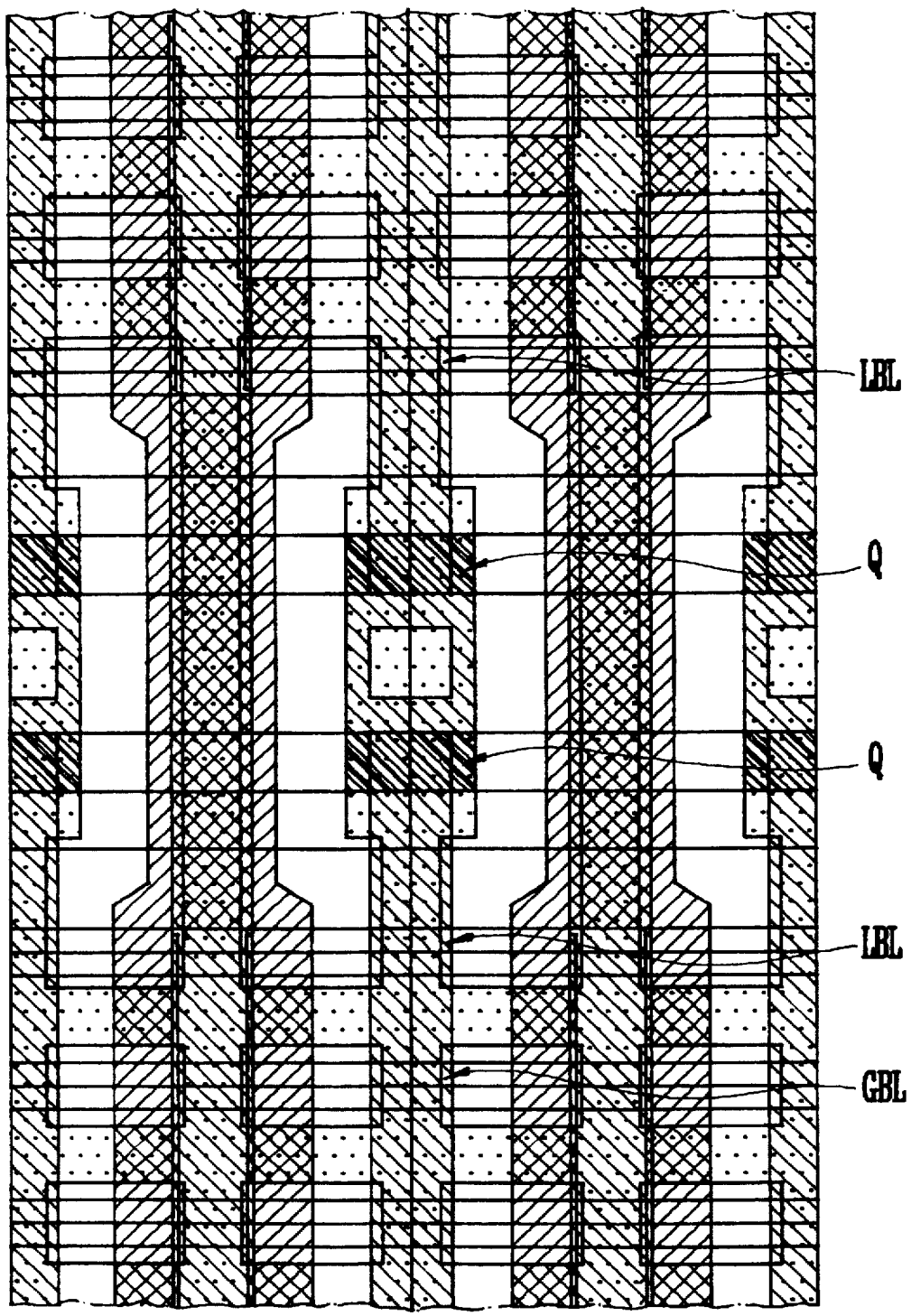
FIG. 4 is a layout of a flash memory device in accordance with the present invention.

Referring now to FIG. 4, there is shown a layout of a flash memory device in accordance with the present invention. The segmentation transistor Q is connected to memory cells in the memory cell array, and a gate electrode of the segmentation transistor Q is arranged in the same direction as the word line.

As described above, in accordance with the present invention, memory cells in each of the memory cell blocks are divided into a plurality of memory cell groups. In each memory cell group, local bit lines are laid out connected by segmentation transistors. When selecting a memory cell, only a local bit line connected to a memory cell selected by an operation of the segmentation transistor is coupled to a global bit line so that the load applied to the bit lines is minimized during the read out operation. Therefore, according to the present invention, higher speed of the operation and lower consumption of power in the device is achieved, improving the operating characteristics of the device.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising:

a plurality of memory cell groups having a plurality of local bit lines and word lines which are arranged in the form of a matrix;

a pair of segmentation transistors connecting corresponding local bit lines between two memory cell groups;

a plurality of connection nodes formed by the connecting of corresponding local bit lines by said pair of segmentation transistors;

a row address buffer which generates an address signal;

a pre-decoder which generates a pre-decoded signal by pre-decoding said address signal;

a segmentation signal generator to selectively turn on said segmentation transistors, wherein said segmentation signal generator operates in response to said pre-decoded signal; and a plurality of global bit lines connected to corresponding connection nodes of said segmentation transistors.

2. A flash memory device comprising:

a plurality of memory cell groups having a plurality of local bit lines and word lines which are arranged in the form of a matrix;

a pair of segmentation transistors connecting corresponding local bit lines between two memory cell groups;

a plurality of connection nodes formed by the connecting of corresponding local bit lines by said pair of segmentation transistors;

a pre-decoder which generates a pre-decoded signal;

a row decoder which generates an output signal based on said pre-decoded signal;

a segmentation signal generator to selectively turn on said segmentation transistors, wherein said segmentation signal generator operates in response to said output signal; and a plurality of global bit lines connected to corresponding connection node of said segmentation transistors.

* * * * *